(12) United States Patent
Cheng

(10) Patent No.: US 11,271,018 B2
(45) Date of Patent: Mar. 8, 2022

(54) ARRAY SUBSTRATE, DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Hongfei Cheng, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 102 days.

(21) Appl. No.: 16/634,258

(22) PCT Filed: Aug. 8, 2019

(86) PCT No.: PCT/CN2019/099787
§ 371 (c)(1),
(2) Date: Jan. 27, 2020

(87) PCT Pub. No.: WO2020/063128
PCT Pub. Date: Apr. 2, 2020

(65) Prior Publication Data
US 2021/0074731 A1 Mar. 11, 2021

(30) Foreign Application Priority Data
Sep. 27, 2018 (CN) .......................... 201811130854.6

(51) Int. Cl.
*H01L 27/12* (2006.01)
*H01L 51/00* (2006.01)
(Continued)

(52) U.S. Cl.
CPC ......... *H01L 27/124* (2013.01); *G09G 3/3275* (2013.01); *H01L 27/3276* (2013.01); *H01L 51/0097* (2013.01)

(58) Field of Classification Search
CPC ............... H01L 27/124; H01L 27/3276; H01L 51/0097; H01L 27/1248; H01L 27/3258;
(Continued)

(56) References Cited

U.S. PATENT DOCUMENTS

2015/0070616 A1* 3/2015 Ogasawara ........... G02F 1/1368
349/43
2017/0229674 A1 8/2017 Jin et al.
(Continued)

FOREIGN PATENT DOCUMENTS

CN 105068373 A 11/2015
CN 106784377 A 5/2017
(Continued)

OTHER PUBLICATIONS

First Office Action for Chinese Application No. 201811130854.6, dated Mar. 17, 2020, 8 Pages.
(Continued)

*Primary Examiner* — Kyoung Lee
(74) *Attorney, Agent, or Firm* — Brooks Kushman P.C.

(57) ABSTRACT

An array substrate, a display panel and a display device are provided. The array substrate includes: a substrate body including a display area and a non-display area, wherein the non-display area includes a fan-out area in which a fan-out signal line is arranged, and the fan-out signal line is connected to a signal line within the display area. The fan-out area includes an inorganic insulation layer arranged between the substrate body and a planarization layer, the inorganic insulation layer is provided with a first groove, and an orthographic projection of at least a part of the fan-out signal line onto the substrate body is within an orthographic projection of the first groove onto the substrate body.

18 Claims, 7 Drawing Sheets

(51) Int. Cl.
  *G09G 3/3275* (2016.01)
  *H01L 27/32* (2006.01)
(58) Field of Classification Search
  CPC ............... G09G 3/3275; G09G 3/3233; G09G
                                                2300/0426
  See application file for complete search history.

(56) References Cited

U.S. PATENT DOCUMENTS

2017/0262109 A1* 9/2017 Choi .................. H01L 51/5253
2018/0102399 A1  4/2018 Cho et al.
2018/0136527 A1  5/2018 Park et al.
2018/0138448 A1  5/2018 Jin et al.

FOREIGN PATENT DOCUMENTS

| CN | 107180848 A | 9/2017 |
|----|-------------|--------|
| CN | 107424520 A | 12/2017 |
| CN | 107919377 A | 4/2018 |
| CN | 108074956 A | 5/2018 |
| CN | 108281386 A | 7/2018 |
| CN | 108288637 A | 7/2018 |
| CN | 109273503 A | 1/2019 |

OTHER PUBLICATIONS

International Search Report and Written Opinion for Application No. PCT/CN2019/099787, dated Nov. 6, 2019, 9 Pages.

* cited by examiner

ARRAY SUBSTRATE, DISPLAY PANEL AND DISPLAY DEVICE

CROSS-REFERENCE TO RELATED APPLICATIONS

This application is the U.S. national phase of PCT Application No. PCT/CN2019/099787 filed on Aug. 8, 2019, which claims priority to Chinese Patent Application No. 201811130854.6 filed on Sep. 27, 2018, which are incorporated herein by reference in their entireties.

TECHNICAL FIELD

The present disclosure relates to the field of display technologies, in particular to an array substrate, a display panel and a display device.

BACKGROUND

An Organic Light emitting Diode (OLED) display, also known as an organic electroluminescence display, is widely used in display devices due to its characteristics of self-illumination, being thin and light, and power-saving. In addition, a current OLED display screen can be made into a flexible screen, which makes display products being more diversified and has wide application prospect in market.

SUMMARY

An object of the present disclosure aim is to provide an array substrate, a display panel and a display device.

The present disclosure provides an array substrate, including: a substrate body including a display area and a non-display area, wherein the non-display area includes a fan-out area in which a fan-out signal line is arranged, and the fan-out signal line is connected to a signal line within the display area. The fan-out area includes an inorganic insulation layer arranged between the substrate body and a planarization layer, the inorganic insulation layer is provided with a first groove, and an orthographic projection of at least a part of the fan-out signal line onto the substrate body is within an orthographic projection of the first groove onto the substrate body.

Optionally, with respect to the array substrate, the planarization layer is deposited on the fan-out signal line and connected to the fan-out signal line.

Optionally, with respect to the array substrate, a bottom of the first groove is opposite to an opening of the first groove, a part of a surface of the substrate body constitutes the bottom of the first groove, and a part of the fan-out signal line arranged on the bottom of the first groove is in direct contact with the substrate body.

Optionally, a bottom of the first groove is opposite to an opening of the first groove, a part of a surface of the substrate body constitutes the bottom of the first groove, the first groove is filled with an organic polymer material layer, the organic polymer material layer is in direct contact with the bottom of the first groove, the fan-out signal line is arranged on a side of the organic polymer material layer distal to the substrate body, and is in direct contact with the organic polymer material layer, and the planarization layer is arranged on a side of the fan-out signal line distal to the substrate body.

Optionally, a bottom of the first groove is opposite to an opening of the first groove, a part of a surface of the substrate body constitutes the bottom of the first groove, the organic polymer material layer is in direct contact with the part of the surface of the substrate body.

Optionally, with respect to the array substrate, the inorganic insulation layer includes a buffer layer, a gate insulation layer and an interlayer insulation layer successively arranged on the substrate body, a depth of the first groove is not larger than a sum of a thickness of the buffer layer, a thickness of the gate insulation layer and a thickness of the interlayer insulation layer, the fan-out signal line is arranged on the interlayer insulation layer, and a part of the fan-out signal line is arranged in the first groove.

Optionally, with respect to the array substrate, the first groove penetrates through the buffer layer, the gate insulation layer and the interlayer insulation layer to expose a part of a surface of the substrate body, and the fan-out signal line is in direct contact with the part of the surface of the substrate body.

Optionally, with respect to the array substrate, the inorganic insulation layer is of a structure of at least two layers, a size of an opening of the first groove increases gradually in a direction that is perpendicular to the substrate body and away from the substrate body, and the opening is parallel to the substrate body.

Optionally, with respect to the array substrate, a surface of a side wall of the first groove is of a step shape, or is a plane.

Optionally, with respect to the array substrate, the inorganic insulation layer includes a first inorganic insulation sub-layer and a second inorganic insulation sub-layer, and the first inorganic insulation sub-layer and the second inorganic insulation sub-layer are in direct contact with each other.

Optionally, with respect to the array substrate, the inorganic insulation layer includes a buffer layer, a gate insulation layer and an interlayer insulation layer successively arranged on the substrate body, a size of an opening of the first groove on the gate insulation layer is larger than a size of an opening of the first groove on the buffer layer, and a size of an opening of the first groove on the interlayer insulation layer is larger than the size of the opening of the first groove on the gate insulation layer.

Optionally, with respect to the array substrate, a side wall of a part of the first groove penetrating through the gate insulation layer and the interlayer insulation layer is a first plane, a side wall of a part of the first groove penetrating through the buffer layer is a second plane, and the first plane is different from the second plane.

Optionally, with respect to the array substrate, a side wall of a part of the first groove penetrating through the interlayer insulation layer is a third plane, a side wall of a part of the first groove penetrating through the gate insulation layer and the buffer layer is a fourth plane, and the third plane is different from the fourth plane.

Optionally, with respect to the array substrate, a part of the organic polymer material layer is located outside the first groove and is attached to the inorganic insulation layer.

Optionally, with respect to the array substrate, the fan-out signal line includes a first line segment and a second line segment, wherein the first line segment and a data line of a pixel unit are arranged on a same layer and made of a same material, the second line segment and a gate line of the pixel unit are arranged on a same layer and made of a same material, and the first line segment is arranged in the first groove.

Optionally, with respect to the array substrate, the substrate body is a flexible substrate body.

Optionally, with respect to the array substrate, the organic polymer material layer is a flexible organic polymer material layer.

Optionally, with respect to the array substrate, a plurality of pixel units is arranged in the display area, and a driving circuit is further arranged within the non-display area or the display area, and the driving circuit is connected to the plurality of pixel units via the fan-out signal lines and the signal lines in the display area.

The embodiment of the present disclosure further provides a display panel, including any one of the array substrates described above.

The embodiment of the present disclosure further provides a display device, including the display panel described above.

DETAILED DESCRIPTION

Currently, in order to simplify a structure of the flexible OLED display, an Integrated Circuit (IC) of a driving chip may further be directly formed on a flexible substrate where a display area has been formed, and a part of the flexible substrate where a driving circuit is arranged is bent relative to a part of the flexible substrate where the display area is arranged, such that usually the part corresponding to the driving circuit is bent to a back side of the part corresponding to the display area. Based on the above configuration structure, a signal line connecting the driving circuit and the display area is arranged on a bending area of the flexible substrate.

In the related art, a multi-layered inorganic layer may be formed in the bending area, so there is a high risk that the signal line connecting the driving circuit and the display area is broken, which affects the performance of the flexible OLED display.

In order to make a technical problem to be solved, a technical solution and an advantage of the present disclosure clearer, the technical solutions in the embodiments of the present disclosure will be described hereinafter in detail with reference to the drawings of the embodiments of the present disclosure.

In order to solve a problem that the signal line connecting the driving circuit and the display area is easy to be broken, an array substrate is provided in the embodiment of the present disclosure, wherein an inorganic insulation layer of a fan-out area is provided with a groove, so as to reduce a thickness of the inorganic insulation layer in the fan-out area and increase a thickness of a flexible planarization layer, thereby solving the problem that the signal line is easy to be broken due to the bending of the fan-out area.

In the embodiment of the present disclosure, the array substrate includes: a flexible substrate body including a pixel area provided with a plurality of pixel units and a fan-out area provided with a fan-out signal line, and the fan-out signal line is connected to a signal line in the display area. The fan-out area includes an inorganic insulation layer arranged between the substrate body and a planarization layer, the inorganic insulation layer is provided with a first groove, and at least a part of the fan-out signal line is arranged in the groove.

Figure 1:
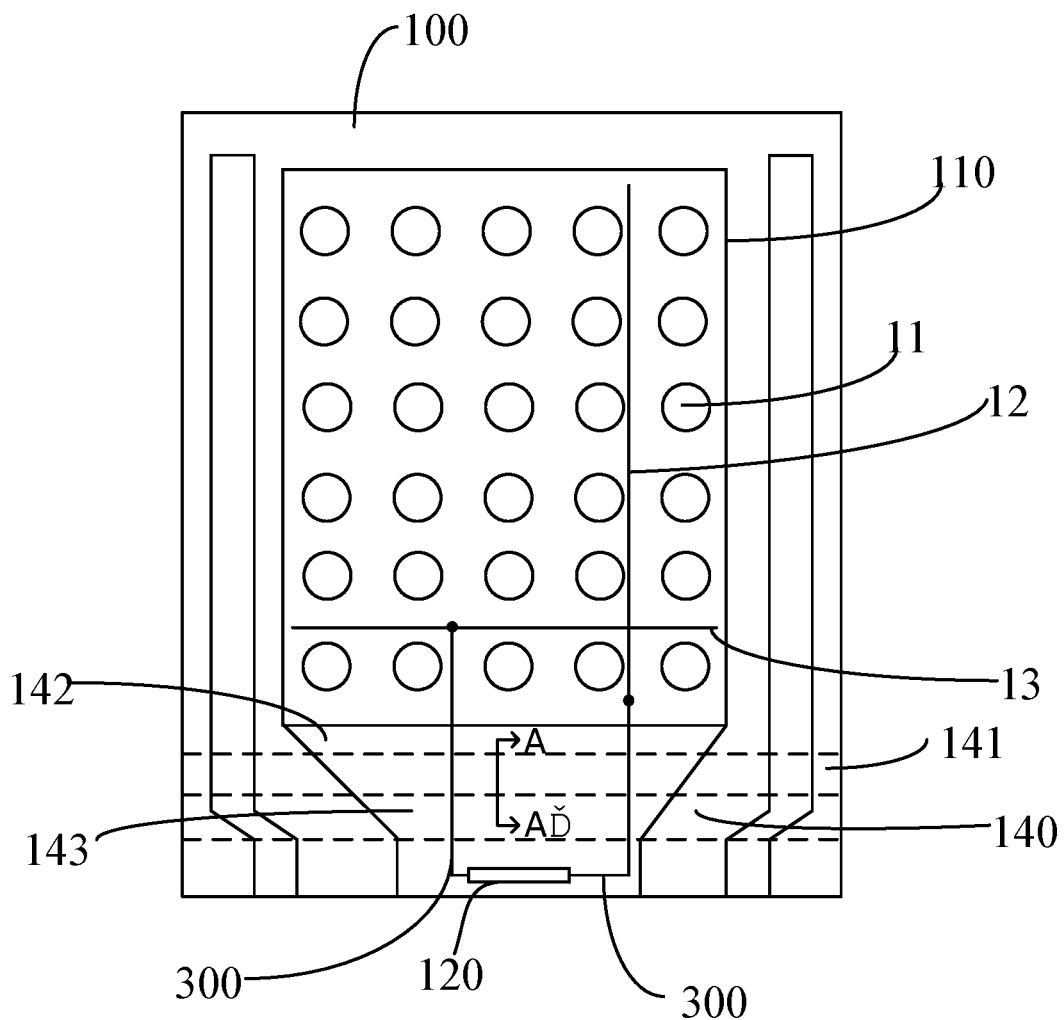
FIG. 1 is a plane schematic diagram of the array substrate in the embodiment of the present disclosure.

As shown in FIG. 1, it is a plane schematic diagram of the array substrate in the embodiment of the present disclosure. A flexible substrate body 100 of the array substrate includes a pixel area 110 corresponding to a display area, and a driving circuit 120 is further provided on the substrate body 100. The driving circuit 120 is connected to a signal line of the pixel area 110 through a fan-out signal line, so an arrangement area of the fan-out signal line on the substrate body 100, i.e., an area between the pixel area 110 and the driving circuit 120, is considered as a fan-out area 140. As shown in FIG. 1, a plurality of pixel units 11 is arranged in the display area, and the driving circuit 120 is connected to the plurality of pixel units 11 through a fan-out signal line 300 and a gate line 13 and a data line 12 in the display area. It should be appreciated by a person skilled in the art that the quantity and the structure of the pixel units, the driving circuit, the gate line, the data line and the like shown in FIG. 1 are for illustration purposes only, which does not indicate the actual specific quantity and structure of these members on the array substrate. Hereinafter, the schematic specific structure of the pixel units, the driving circuit, the gate line, the data line and the like will be described with reference to other drawings. In addition, the flexible substrate body 100 can be made of a polymer material such as polyimide plastic, polyetheretherketone or transparent conductive polyester, and has the characteristics of light weight, small thickness, and being soft and bendable.

Figure 2:
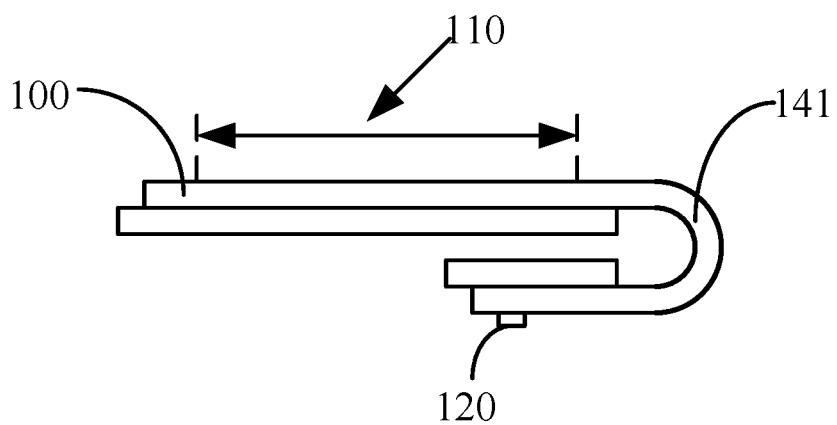
FIG. 2 is a structural schematic diagram of the array substrate forming a bending state in the embodiment of the present disclosure.

FIG. 2 is a structural schematic diagram of the array substrate forming a bending state in the embodiment of the present disclosure. Since the substrate body 100 is made of flexible material, the fan-out area 140 can be bent to a back side of the pixel area 110. Based on the bending state of the fan-out area 140, a part of the fan-out area 140 is formed into a bending area 141, and the bending area 141 divides the rest area of the fan-out area 140 into a first fan-out area 142 and a second fan-out area 143, as shown in FIG. 1. The fan-out area 140 includes the bending area 141, the first fan-out area 142 and the second fan-out area 143.

In the embodiment of the present disclosure, the fan-out area 140 includes the inorganic insulation layer arranged between the substrate body and the planarization layer, the inorganic insulation layer is provided with the groove, and at least a part of the fan-out signal line is arranged in the groove.

Specifically, a part of the fan-out area 140 provided with the groove is formed into the bending area 141, and the inorganic insulation layer of the bending area 141 is provided with the groove, so as to reduce the thickness of the inorganic insulation layer in the bending area 141 and increase the thickness of the flexible planarization layer, thereby solving the problem that the signal line is easy to be broken due to the bending of the bending area 141.

It should be appreciated, generally the flexible array substrate is applied to an OLED display, and a detailed description of the implementation structure of the array substrate in the embodiment of the present disclosure will be given in the following by taking the array substrate being applied to the OLED display as an example.

Figure 3:
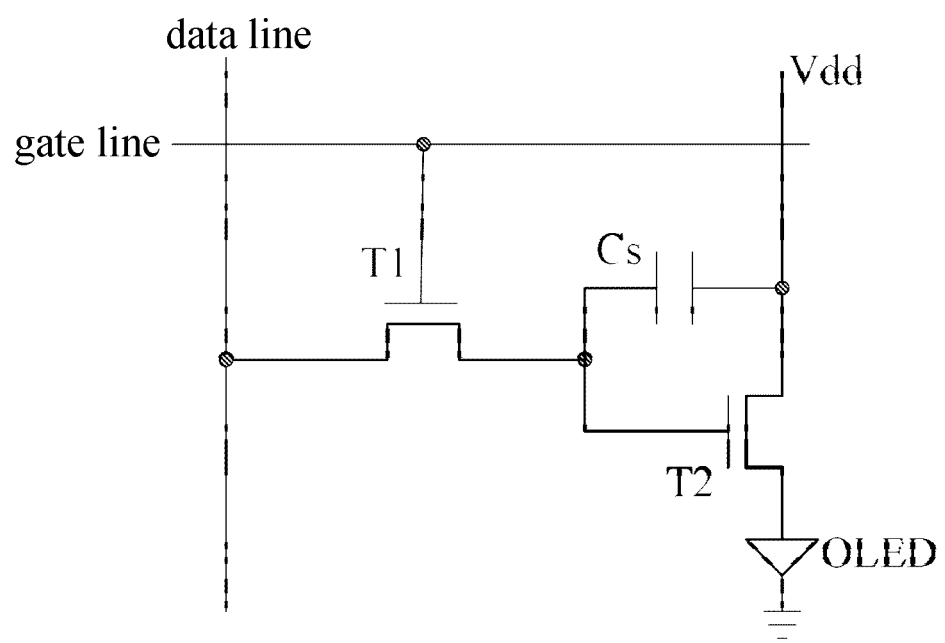
FIG. 3 is a circuit schematic diagram of a driving circuit of a pixel unit on the array substrate in an OLED display.
Figure 4:
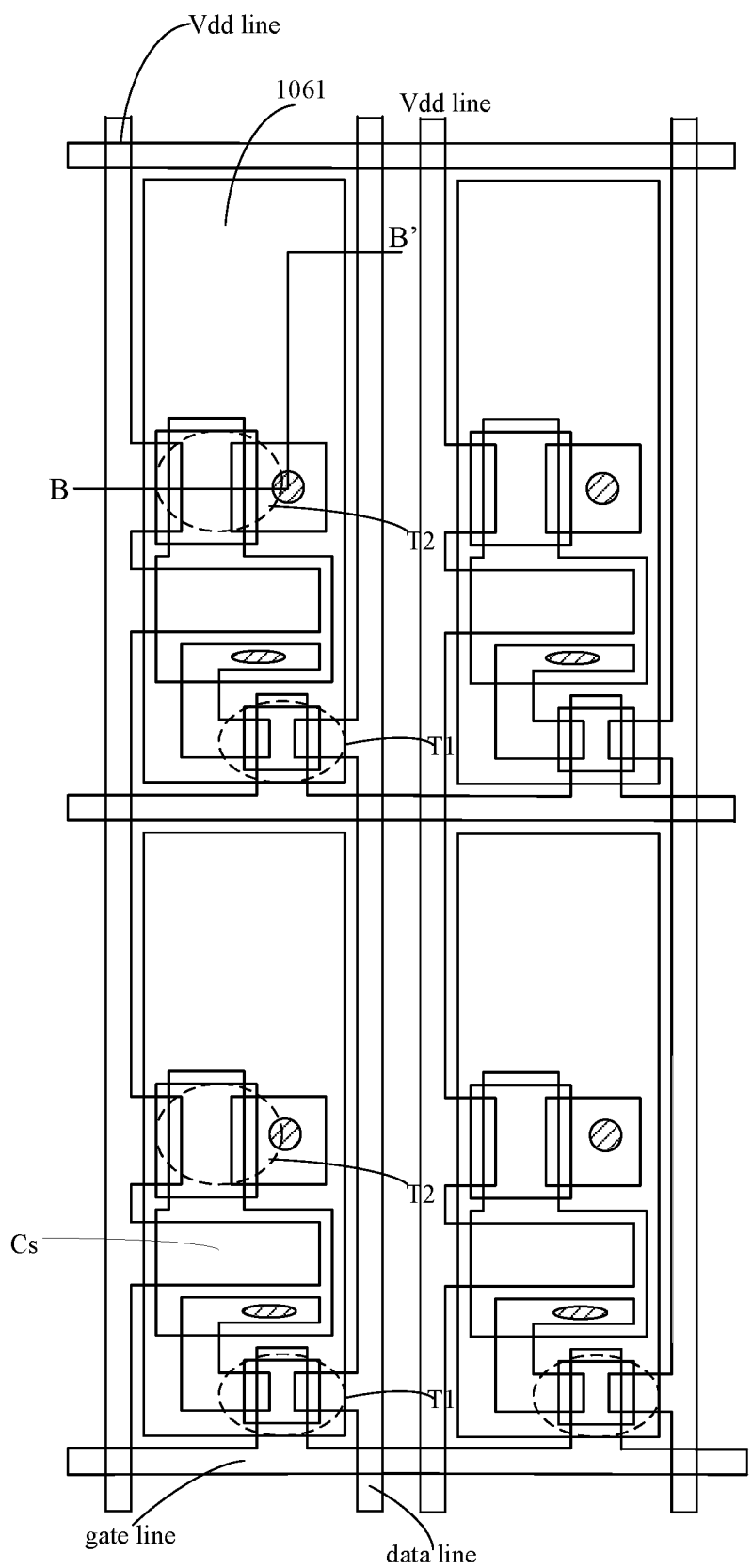
FIG. 4 is a plane structural schematic diagram of the pixel units on the array substrate.

FIG. 3 is a circuit schematic diagram of a driving circuit of a pixel unit on the array substrate in an OLED display, and FIG. 4 is a plane structural schematic diagram of the pixel units on the array substrate. Referring to FIG. 3 and FIG. 4, the pixel unit of the array substrate includes a Thin Film Transistor (TFT) T1 for implementing OLED switching control, a TFT T2 for driving the OLED and a storage capacitor Cs, a gate electrode of the switch TFT T1 is connected to a gate line, a source electrode of the switch TFT T1 is connected to a data line, a drain electrode of the switch TFT T1 is connected to a gate electrode of the driving TFT T2, and a source electrode of the driving TFT T2 is connected to a power line ($V_{dd}$), and a drain electrode of the driving TFT T2 is connected to a pixel electrode (an anode layer 1061 of the OLED); am electrode of the storage capacitor Cs is connected to the drain electrode of the switch TFT T1 and the gate electrode of the drive TFT T2, and the other electrode of the storage capacitor Cs is connected to the source electrode of the TFT T2.

Figure 5:
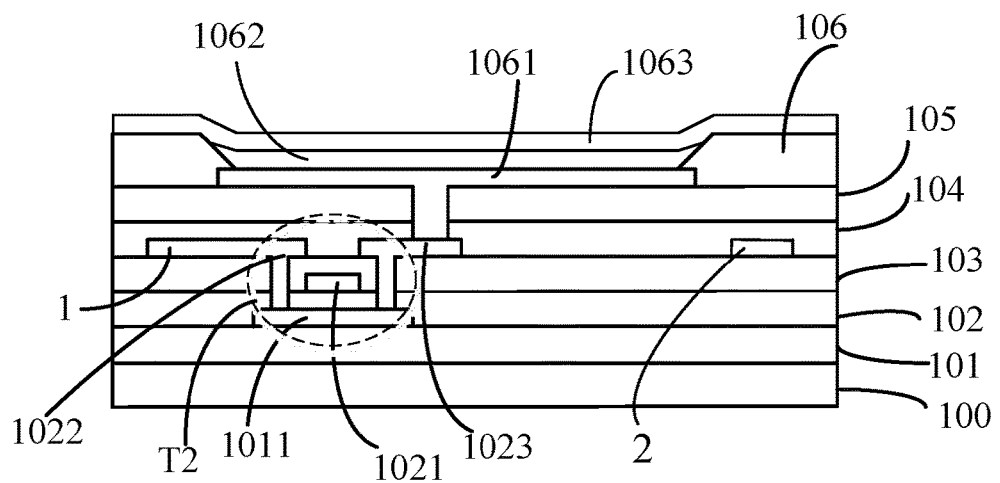
FIG. 5 is a sectional schematic view of a portion along a line B-B' in FIG. 4.

Taking a sectional schematic view from the part of line B-B' in FIG. 4 as an example, each pixel unit in the pixel area of the array substrate, as shown in FIG. 5, includes: the substrate body 100, a buffer layer 101, a gate insulation layer 102, an interlayer insulation layer 103, a passivation layer 104, a planarization layer 105 and a pixel definition layer 106 successively arranged from top to bottom, and a corresponding pixel definition layer 106 is provided with an anode layer 1061, an organic light-emitting layer 1062 and a cathode layer 1063 of the OLED.

Further, according to FIG. 5, an active layer 1011 is further disposed on the buffer layer 101, a gate electrode 1021 of the driving TFT T2 is disposed on the gate insulation layer 102, a source electrode 1022 and a drain electrode 1023 of the driving TFT T2 are disposed in a via hole penetrating through the gate insulation layer 102 and the interlayer insulation layer 103, and a Vdd line 1 and a data line 2 are disposed on the interlayer insulation layer 103. In combination with FIG. 3, the drain electrode 1023 of the driving TFT T2 is connected to the anode layer 1061 of the OLED through the via hole, and the source electrode 1022 for driving the TFT T2 is connected to the Vdd line.

The above FIG. 4 and FIG. 5 show one implementation structure of the pixel area 110 on the substrate body 100. It should be appreciated that, the buffer layer 101, the gate insulation layer 102, the interlayer insulation layer 103, the passivation layer 104 and the planarization layer 105 are provided in the corresponding fan-out area 140 in FIG. 1, and the buffer layer 101, the gate insulation layer 102, the interlayer insulation layer 103, the passivation layer 104 and the planarization layer 105 corresponds to the pixel area 110 and are manufactured at a same layer with the pixel area 110.

Generally, the buffer layer 101, the gate insulation layer 102, the interlayer insulation layer 103 and the passivation layer 104 on the substrate body 100 are made of inorganic material, and there is a high risk of being broken when being bent for multiple times. On the array substrate according to the embodiment of the present disclosure, the inorganic insulation layer on the substrate body 100 of the fan-out area 140 is provided with the groove, and at least a part of the fan-out signal line is arranged in the groove, so as to reduce the thickness of the inorganic insulation layer in the bending area 141 of the fan-out area 140 and increase the thickness of the flexible planarization layer, thereby solving the problem that the signal line is easy to be broken due to the bending of the inorganic insulation layer in the bending area.

Specifically, on the array substrate according to the embodiment of the present disclosure, the inorganic insulation layer provided with the groove may be any one of the buffer layer 101, the gate insulation layer 102, the interlayer insulation layer 103 and the passivation layer 104, or at least two adjacent ones among the buffer layer 101, the gate insulation layer 102, the interlayer insulation layer 103 and the passivation layer 104. The inorganic insulating layer provided with the groove 200 may include three inorganic insulation sub-layers in direct contact with each other. As shown in FIG. 6 to FIG. 11, the inorganic insulating layer includes the buffer layer 101, the gate insulation layer 102 and the interlayer insulation layer 103, or the inorganic insulating layer provided with the groove 200 may include the gate insulation layer 102 and the interlayer insulation layer 103, which are, as shown in FIG. 12, included in the inorganic insulating layer.

Optionally, with respect to the array substrate according to the embodiment of the present disclosure, the fan-out signal line of the fan-out area 140 is in direct contact with a flexible organic polymer material layer in the groove to increase the flexibility of the signal line. The flexible organic polymer material layer is filled in the groove, and the fan-out signal line is in direct contact with the flexible organic polymer material layer; or, the fan-out signal line is in direct contact with the substrate body made of the flexible organic polymer material.

Optionally, the flexible organic polymer material layer may be made of resin (e.g. epoxy resin), but the present disclosure is not limited to.

Figure 6:
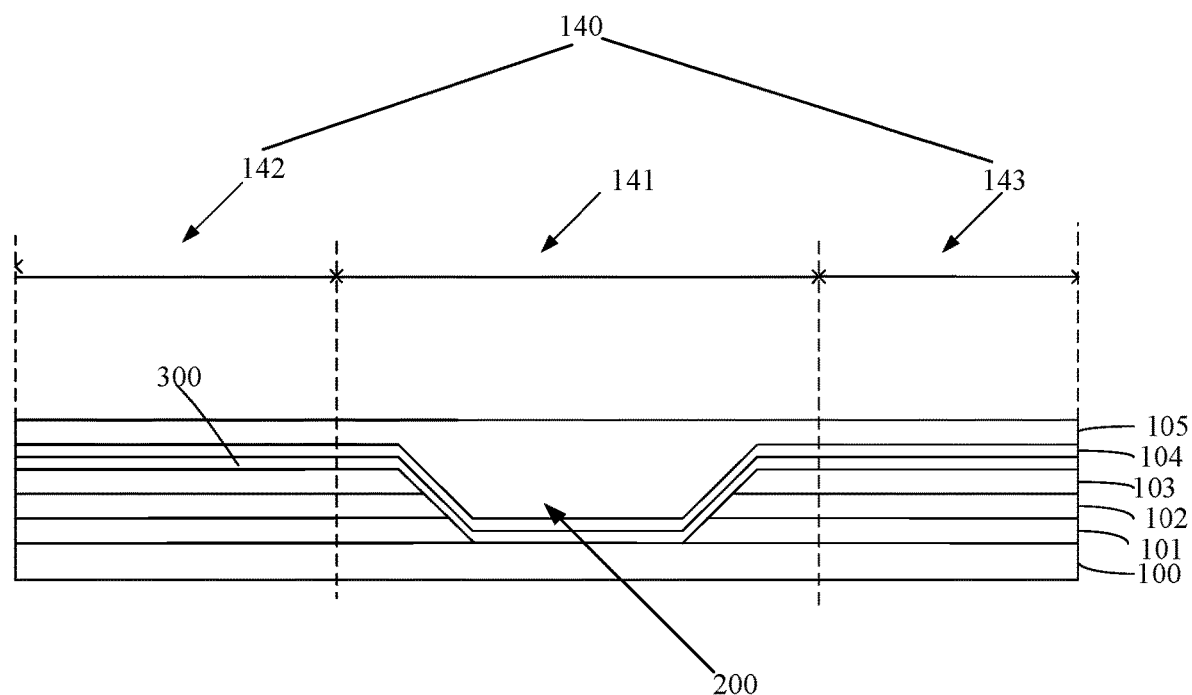
FIG. 6 is a sectional schematic view of the fan-out area at a line A-A' in some implementation structures of the array substrate according to the embodiment of the present disclosure.

In some implementation structures of the array substrate according to the embodiment of the present disclosure, in combination with FIG. 1, a sectional schematic view of the fan-out area at the line A-A' is shown in FIG. 6. In the bending area 141 of the fan-out area 140, all of the buffer layer 101, the gate insulation layer 102 and the interlayer insulation layer 103 are provided with respective grooves, and the respective grooves in the buffer layer 101, the gate insulation layer 102 and the interlayer insulation layer 103 are mutually connected to form the groove 200 penetrating from the interlayer insulation layer 103 to the buffer layer 101. That is, the respective grooves in the buffer layer 101, the gate insulation layer 102 and the interlayer insulation layer 103 are mutually connected and combined to form the groove. The fan-out signal line 300 is arranged on the interlayer insulation layer 103. A part of the fan-out signal line 300 extends via the groove of the interlayer insulation layer 103, the groove of the gate insulation layer 102 and the groove of the buffer layer 101 in that order in the groove 200, and then is deposited on the substrate body 100. That is, in the fan-out area 140, the quantity of the inorganic insulation layers provided with the grooves is at least two, and the grooves of at least two inorganic insulation layers are connected to each other in a top to bottom manner. The fan-out signal line 300 is arranged on all of the inorganic insulation layers provided with the grooves, and a part of the fan-out signal line 300 passes through the groove of each inorganic insulation layer successively.

Since the substrate body 100 is made of flexible material, the fan-out signal line 300 is in direct contact with the flexible organic polymer material substrate body in the groove 200 to ensure the flexibility of the part of the fan-out signal line 300 in the bending area 141 of the fan-out area 140, and reduce the risk of being broken.

In the embodiment of the present disclosure, in combination with FIGS. 1 to 5, the fan-out signal line 300 and the data line of the pixel area 110 are arranged on the same layer and made of the same material on the entire fan-out area 140. Optionally, the fan-out signal line 300 is connected to a lead-out line of the data line, and the fan-out signal line 300 is connected to the signal line of the pixel area 110 through the lead-out line of the data line.

In addition, as shown in FIG. 6, in the embodiment of the present disclosure, the grooves provided in the buffer layer 101, the gate insulation layer 102, and the interlayer insulation layer 103 respectively are arranged with a same centerline. A size of the groove provided in the interlayer insulation layer 103 is larger than a size of the groove provided in the gate insulation layer 102, and the size of the groove provided in the gate insulation layer 102 is larger than a size of the groove provided in the buffer layer 101. That is, when at least two inorganic insulation layers are provided with grooves from top to bottom in the fan-out area 140, and a distance from a first inorganic insulation layer to the substrate body 100 is larger than a distance from a second inorganic insulation layer to the substrate body 100, a size of the groove provided in the first inorganic insulation layer is larger than a size of the groove provided in the second inorganic insulation layer, an orthographic projection of the groove provided in the first inorganic insulation layer onto a plane where the second inorganic insulation layer is located covers the entire groove of the second inorganic insulation layer. By adopting the above configuration, in the bending area 141 of the fan-out area 140, a structure is formed by combining a plurality of grooves provided in the respective inorganic insulation layers, and the structure enables the entire groove 200 where the fan-out signal line 300 extends through to be provided with a top opening and a bottom opening, and the top opening is larger than the bottom opening.

In addition, optionally, as shown in FIG. 6, all surfaces of inner side walls of the grooves formed in the buffer layer 101, the gate insulation layer 102 and the interlayer insulation layer 103 are oblique planes, and the surfaces of the inner side walls of the grooves formed in the buffer layer 101, the gate insulation layer 102 and the interlayer insulation layer 103 are combined into two planes opposite to each other. That is, when at least two inorganic insulation layers are provided with the grooves from top to bottom in the fan-out area 140, the surface of the inner side wall of the groove provided in each inorganic insulation layer is an oblique plane, and the surfaces of the inner side walls of the grooves provided in the respective inorganic insulation layers are combined into two planes being opposite to each other.

By using some implementation structures of the array substrate according to the embodiment of the present disclosure, the groove penetrating through the buffer layer 101, the gate insulation layer 102 and the interlayer insulation layer 103 in that order is formed in the bending area 141 of the fan-out area 140, and the fan-out signal line 300 arranged on the same layer and made of the same material with the data line is deposited on the interlayer insulation layer 103, the fan-out signal line 300 is, in the bending area, deposited on the flexible substrate body 100 in the groove, and in direct contact with the flexible organic polymer substrate body.

Further, as shown in FIG. 6, the passivation layer 104 and the planarization layer 105 are disposed on the fan-out signal line 300 in that order. Due to the arrangement of the groove, a thickness of the flexible planarization layer 105 is increased, and a thickness of the fragile inorganic layer is reduced. Moreover, since the fan-out signal line 300 is deposited on the flexible organic polymer substrate body, the flexibility of the fan-out signal line 300 in the bending area 141 of the fan-out area 140 can be ensured, thereby reducing the risk of being broken.

Figure 7:
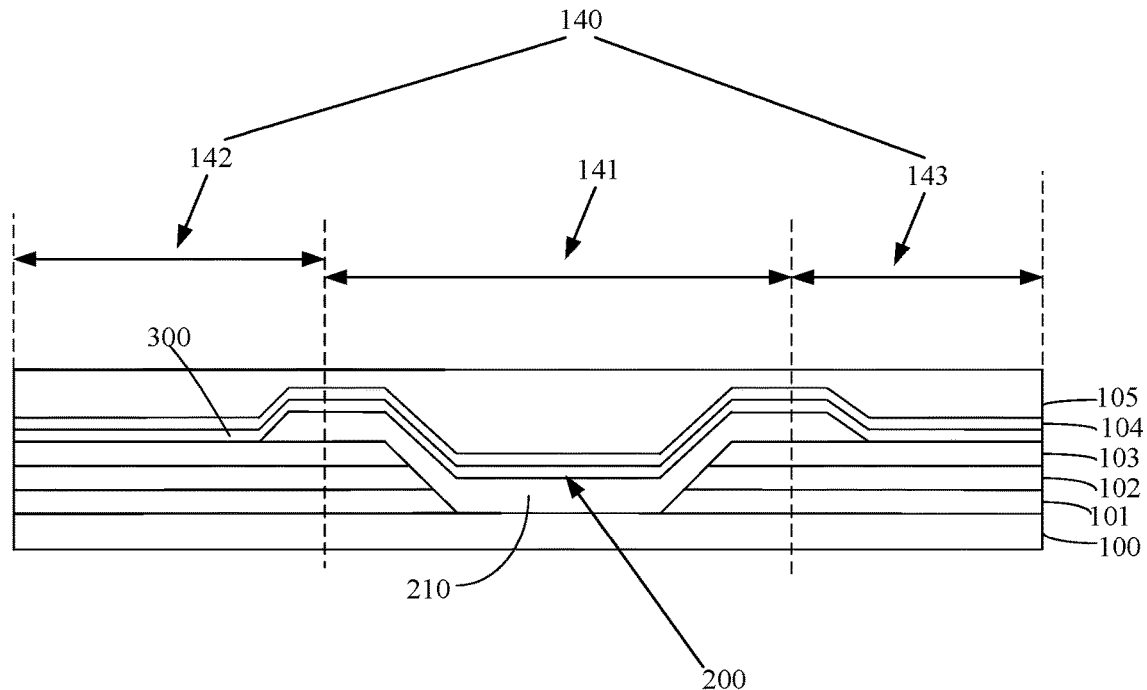
FIG. 7 is another sectional schematic view of the fan-out area at the line A-A' in some implementation structures of the array substrate according to the embodiment of the present disclosure.

In some implementation structures of the array substrate according to the embodiment of the present disclosure, in combination with FIG. 1, a sectional schematic view of the fan-out area at the line A-A' is shown in FIG. 7. In the bending area 141 of the fan-out area 140, the buffer layer 101, the gate insulation layer 102 and the interlayer insulation layer 103 are provided with respective grooves, and the respective grooves in the buffer layer 101, the gate insulation layer 102 and the interlayer insulation layer 103 are mutually connected to form the groove 200 penetrating from the interlayer insulation layer 103 to the buffer layer 101. Further, a resin layer 210 is deposited in the groove 200 in the bending area 141 of the fan-out area 140 in the implementation structure, and the resin layer 210 in the groove 200 is disposed according to the shape of the groove 200. The resin layer 210 is in direct contact with the substrate body 100 at the bottom of the groove 200.

Further, as shown in FIG. 6, a top opening of the groove 200 is located on a plane of a side of the interlayer insulation layer 103 distal to the substrate body 100, and a part of a surface of a side of the substrate body 100 proximate to the flat layer 105 forms a bottom of the groove 200, so that a depth of the groove 200 in the embodiment shown in FIG. 6 (i.e. a distance from the top opening to the bottom) is a sum of a thickness of the buffer layer 101, a thickness of the gate insulation layer 102 and a thickness of the interlayer insulation layer 103. In other embodiments, the depth of the groove 200 may alternatively be smaller than the sum of the thickness of the buffer layer 101, the thickness of the gate insulation layer 102 and the thickness of the interlayer insulation layer 103 (in this case, a position of the top opening of the groove 200 is unchanged, while a position of the bottom moves up), but not larger than the sum of the thickness of the buffer layer 101, the thickness of the gate insulation layer 102 and the thickness of the interlayer insulation layer 103.

Further, as shown in FIG. 6, a size of an opening of the groove 200 parallel to the substrate body 100 increases gradually in a direction being perpendicular to the substrate body 100 and away from the substrate body 100. For example, the size of any opening of the groove 200 that is in the interlayer insulation layer 103 and parallel to the substrate body 100 is larger than the size of any opening of the groove 200 that is in the gate insulation layer 102 and parallel to the substrate body 100, and the size of any opening of the groove 200 that is in the gate insulation layer 102 and parallel to the substrate body 100 is larger than the size of any opening of the groove 200 that is in the buffer layer 101 and parallel to the substrate body 100.

Based on the implementation structure, a part of the fan-out signal line 300 located in the bending area 141 is arranged on the resin layer 210. Since the resin layer 210 is made of flexible organic polymer material, and the resin layer 210 is the flexible organic polymer material layer filled in the groove 200, the fan-out signal line 300 is in direct contact with the flexible organic polymer material layer in the groove 200. The depth of the groove 200 is reduced through the arrangement of the resin layer 210 to ensure the flexibility of the fan-out signal line 300 in the bending area 141 of the fan-out area 140, thereby reducing the risk of being broken.

Further, optionally, as shown in FIG. 7, in the bending area 141 of the fan-out area 140, the resin layer 210 includes a part located inside the groove 200, and a part located outside the groove 200 and in direct contact with the interlayer insulation layer 103. By providing this structure, the resin layer 210 covers the entire bending area of the fan-out area 140, so that the fan-out signal line 300 in the entire bending area is arranged on the flexible organic polymer material layer, thereby reducing the risk of being broken.

In addition, in the implementation structure as shown in FIG. 7, similar to the implementation structure shown in FIG. 6, the fan-out signal line 300 and the data line of the pixel area 110 are arranged on the same layer and made of the same material in the entire fan-out area 140. In addition, as shown in FIG. 7, the respective grooves provided in the buffer layer 101, the gate insulation layer 102, and the interlayer insulation layer 103 are arranged with a same centerline. A size of the groove provided in the interlayer insulation layer 103 is larger than a size of the groove provided in the gate insulation layer 102, and the size of the groove provided in the gate insulation layer 102 is larger than a size of the groove provided in the buffer layer 101. Further, all surfaces of inner side walls of the respective grooves of the buffer layer 101, the gate insulation layer 102 and the interlayer insulation layer 103 are oblique planes, and the surfaces of the inner side walls of the respective grooves of the buffer layer 101, the gate insulation layer 102 and the interlayer insulation layer 103 are combined into two planes being opposite to each other.

By using the implementation structure shown in FIG. 7 of the array substrate according to the embodiment of the present disclosure, in the bending area 141 of the fan-out area 140, the groove penetrating through the buffer layer 101, the gate insulation layer 102 and the interlayer insulation layer 103 in that order is formed, the resin layer 210 is deposited in the groove, and the fan-out signal line 300 arranged on the same layer and made of the same material with the data line is deposited on the resin layer 210. In the bending area, the fan-out signal line 300 is deposited on the resin layer 210 in the groove, and in direct contact with the flexible organic polymer material layer.

Further, as shown in FIG. 7, the passivation layer 104 and the planarization layer 105 are disposed on the fan-out signal line 300 in that order. Due to the arrangement of the groove, a thickness of the flexible planarization layer 105 is increased, and a thickness of the fragile inorganic layer is reduced. Moreover, since the fan-out signal line 300 is deposited on the flexible organic polymer material layer, the flexibility of the fan-out signal line 300 in the bending area 141 of the fan-out area 140 can be ensured, thereby reducing the risk of being broken.

Figure 8:
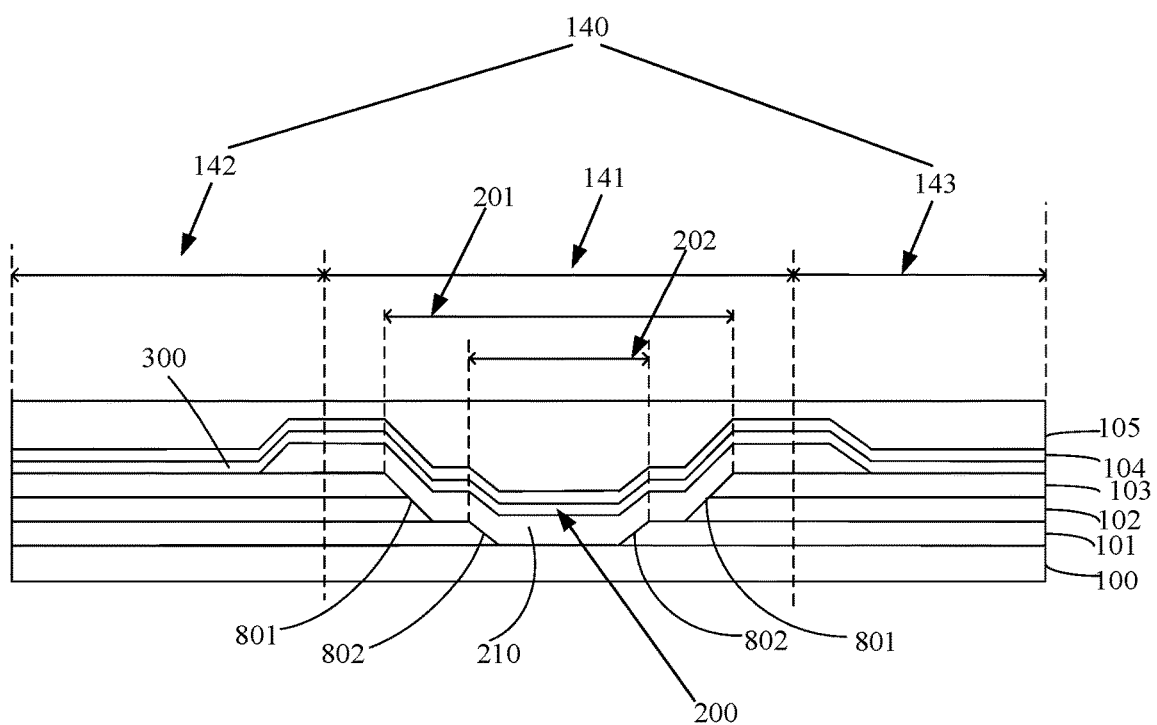
FIG. 8 is still another sectional schematic view of the fan-out area at the line A-A' in some implementation structures of the array substrate according to the embodiment of the present disclosure.

In some implementation structures of the array substrate according to the embodiment of the present disclosure, in combination with FIG. 1, a sectional schematic view of the fan-out area at the line A-A' is shown in FIG. 8. In the bending area 141 of the fan-out area 140, the buffer layer 101, the gate insulation layer 102 and the interlayer insulation layer 103 are provided with respective grooves, and the respective grooves in the buffer layer 101, the gate insulation layer 102 and the interlayer insulation layer 103 are mutually connected to form the groove 200 penetrating from the interlayer insulation layer 103 to the buffer layer 101.

In the implementation structure, as shown in FIG. 8, optionally, the respective grooves in the buffer layer 101, the gate insulation layer 102, and the interlayer insulation layer 103 are arranged with a same centerline. A size of the groove provided in the interlayer insulation layer 103 is larger than a size of the groove provided in the gate insulation layer 102, and the size of the groove provided in the gate insulation layer 102 is larger than a size of the groove provided in the buffer layer 101. That is, when at least two inorganic insulation layers are provided with respective grooves from top to bottom in the fan-out area 140, and a distance from a first inorganic insulation layer to the substrate body 100 is larger than a distance from a second inorganic insulation layer to the substrate body 100, a size of the groove provided in the first inorganic insulation layer is larger than a size of the groove provided in the second inorganic insulation layer.

Further, as shown in FIG. 8, a size of the bottom opening of the groove provided in the gate insulation layer 102 is larger than a size of the top opening of the groove provided in the buffer layer 101. That is, when at least two inorganic insulation layers are provided with respective grooves from top to bottom in the fan-out area 140, and the first inorganic insulation layer provided with the groove is connected with the second inorganic insulation layer provided with the groove, a size of the bottom opening of the groove provided in the first inorganic insulation layer is larger than a size of the top opening of the groove provided in the second inorganic insulation layer.

Further, all of the surfaces of inner side walls of the respective grooves of the buffer layer 101, the gate insulation layer 102 and the interlayer insulation layer 103 are oblique planes, the surfaces of the inner side walls of the respective grooves formed in the gate insulation layer 102 and the interlayer insulation layer 103 are combined into two first planes 801 being opposite to each other, and the surfaces of the inner side walls of the groove formed in the buffer layer 101 are formed into two second planes 802 being opposite to each other, the first plane 801 and the second plane 802 are on different planes. Based on the above configuration structure, as shown in FIG. 8, the groove 200 penetrating from the interlayer insulation layer 103 to the buffer layer 101 includes a first groove part 201 corresponding to the gate insulation layer 102 and the interlayer insulation layer 103 and a second groove part 202 corresponding to the buffer layer 101. Within the groove 200, a step-shaped structure is formed on the buffer layer 101.

Based on the above implementation structure, a resin layer 210 is deposited in the groove 200 in the bending area 141 of the fan-out area 140, and the resin layer 210 in the groove 200 is disposed according to the shape of the groove 200. The resin layer 210 is in direct contact with the substrate body 100 at the bottom of the groove 200.

In addition, a part of the fan-out signal line 300 located in the bending area 141 is arranged on the resin layer 210. Since the resin layer 210 is made of flexible organic polymer material, the fan-out signal line 300 is in direct contact with the flexible organic polymer material layer (i.e., the resin layer 210) in the groove 200. In the implementation structure, since the groove 200 is formed as the step-shaped structure as shown in FIG. 8, as compared with the implementation structure in FIG. 7, the gradient of the groove 200 in the bending area can be reduced, thereby reducing the breaking risk of the fan-out signal line 300. In an embodiment, the thickness of at least the part of the resin layer 210 in the groove 200 is substantially the same, so that a groove is further formed on a surface of the part of the resin layer 210 in the groove 200 being proximate to the planarization layer 105, a shape and orientation of the groove are substantially the same as the shape and orientation of the groove 200.

The resin layer 210 includes a part located inside the groove 200 and a part located outside the groove 200 and in direct contact with the interlayer insulation layer 103, so that the resin layer 210 covers the entire bending area of the fan-out area 140.

In addition, in this implementation structure, similar to the above implementation structure, the fan-out signal line 300 and the data line of the pixel area 110 are arranged on the same layer and made of same material in the entire fan-out area 140.

By using the implementation structure shown in FIG. 8 of the array substrate according to the embodiment of the present disclosure, due to the arrangement of the groove 200, a thickness of the flexible planarization layer 105 is increased, and a thickness of the fragile inorganic layer is reduced. Moreover, since the fan-out signal line 300 is deposited on the flexible organic polymer material layer, the flexibility of the fan-out signal line 300 in the bending area 141 of the fan-out area 140 can be ensured, thereby reducing the risk of being broken. In addition, the groove 200 is further set as the step-shaped structure, so that the gradient of the groove 200 in the bending area is reduced, and the gradient of the fan-out signal line 300 in the groove 200 is reduced, thereby further reducing the breaking risk of the fan-out signal line 300.

Figure 9:
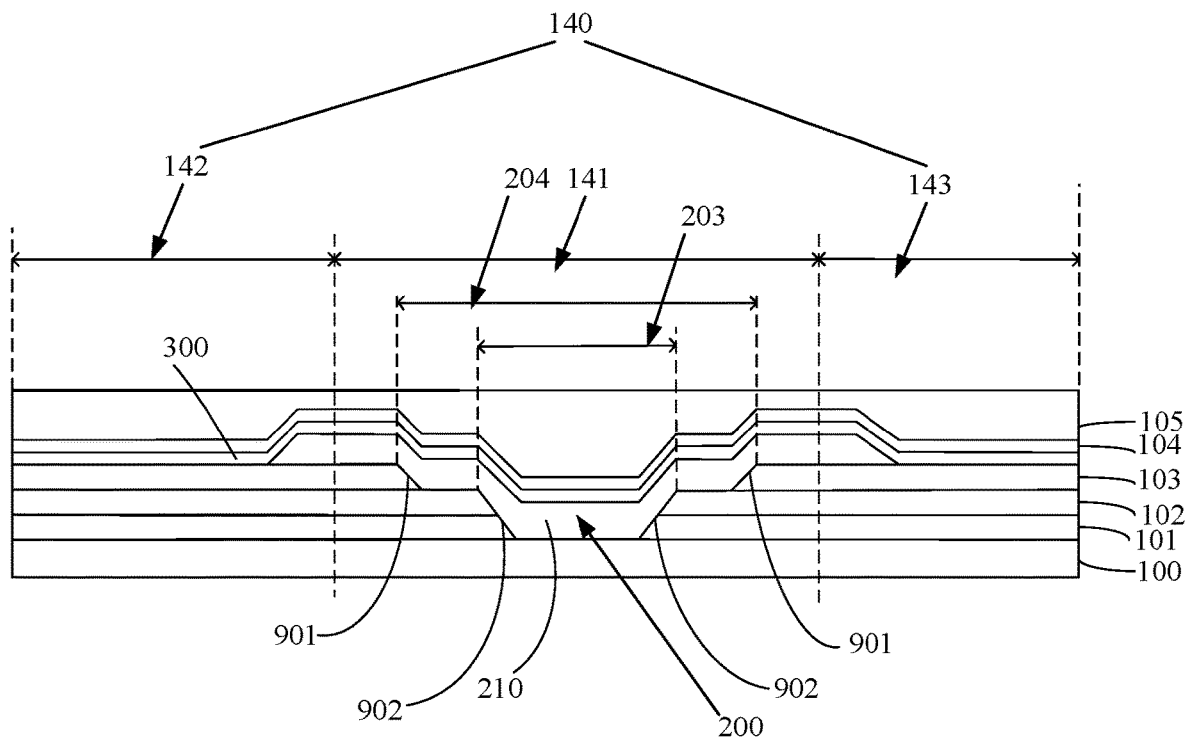
FIG. 9 is yet still another sectional schematic view of the fan-out area at the line A-A' in some implementation structures of the array substrate according to the embodiment of the present disclosure.

In some implementation structures of the array substrate according to the embodiment of the present disclosure, in combination with FIG. 1, a sectional schematic view of the fan-out area at the line A-A' is shown in FIG. 9. Similar as the implementation structure shown in FIG. 8, in the bending area 141 of the fan-out area 140, the buffer layer 101, the gate insulation layer 102 and the interlayer insulation layer 103 are provided with respective grooves, and the respective grooves in the buffer layer 101, the gate insulation layer 102 and the interlayer insulation layer 103 are mutually connected to form the groove 200 penetrating from the interlayer insulation layer 103 to the buffer layer 101.

Unlike the implementation structure shown in FIG. 8, a size of the bottom opening of the groove provided in the interlayer insulation layer 103 is larger than a size of the top opening of the groove provided in the gate insulation layer 102. All surfaces of inner side walls of the respective grooves of the buffer layer 101, the gate insulation layer 102 and the interlayer insulation layer 103 are oblique planes, the surfaces of the inner side walls of the respective grooves provided in the buffer layer 101 and the gate insulation layer 102 are combined into two fourth planes 901 being opposite to each other, and the surfaces of the inner side walls of the groove provided in the interlayer insulation layer 103 are formed into two third planes 902 being opposite to each other, the fourth plane 901 and the third plane 902 are on different planes.

Based on the above configuration structure, as shown in FIG. 9, the groove 200 penetrating from the interlayer insulation layer 103 to the buffer layer 101 includes a third groove part 203 corresponding to the buffer layer 101 and the gate insulation layer 102 and a fourth groove part 204 corresponding to the interlayer insulation layer 103. Inside the groove 200, a step-shaped structure which is different from that in the implementation structure shown in FIG. 8 is formed on the buffer layer 101, and the gradient of the groove 200 in the bending area can also be reduced.

In addition, in the implementation structure shown in FIG. 9, the arrangement mode of the fan-out signal line 300 and the arrangement mode of the resin layer 210 are the same as those in the implementation structure shown in FIG. 8, which will not be repeated herein.

Figure 10:
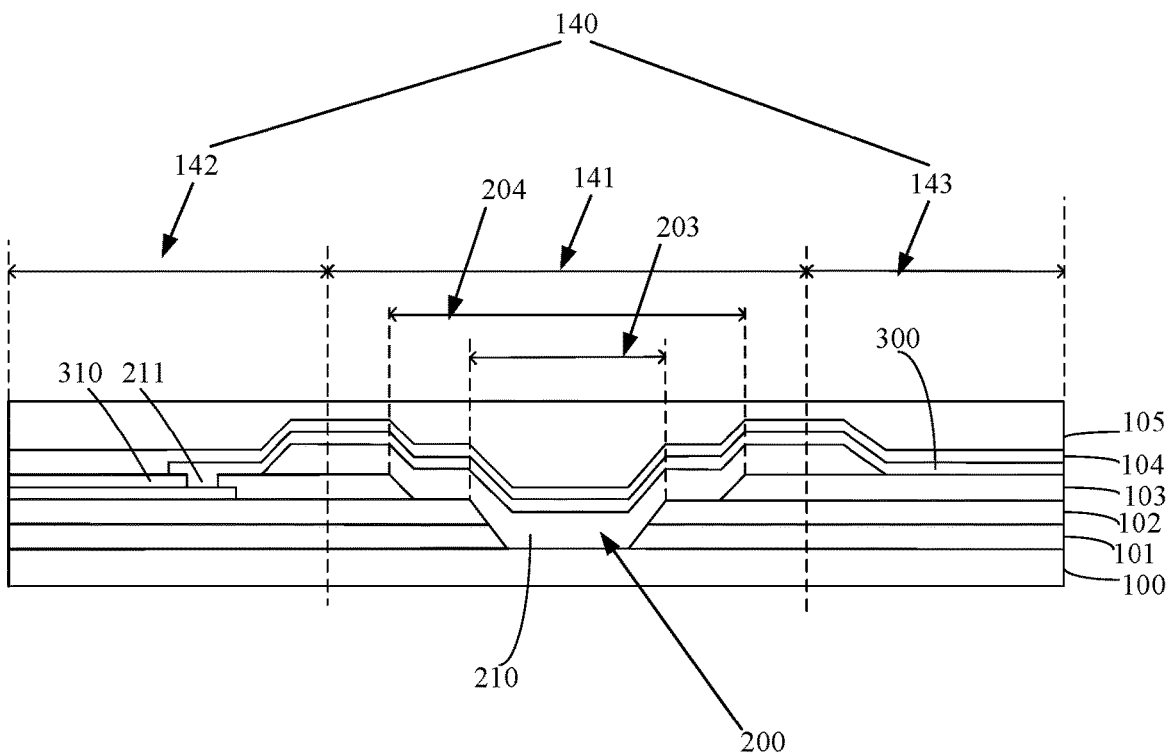
FIG. 10 is yet still another sectional schematic view of the fan-out area at the line A-A' in some implementation structures of the array substrate according to the embodiment of the present disclosure.

In the above implementation structures shown in FIG. 6 to FIG. 9, the fan-out signal line 300 and the data line are arranged on the same layer and made of same material in the entire fan-out area 140. In addition, an array substrate with the implementation structure shown in FIG. 10 is further provided in the present disclosure. The fan-out signal line includes two line segments located on different material layers in the fan-out area 140.

In the array substrate with the implementation structure shown in FIG. 10, the buffer layer 101, the gate insulation layer 102 and the interlayer insulation layer 103 are provided with respective grooves in the bending area 141 of the fan-out area 140, and the respective grooves in the buffer layer 101, the gate insulation layer 102 and the interlayer insulation layer 103 are mutually connected to form the groove 200 penetrating from the interlayer insulation layer 103 to the buffer layer 101.

In addition, similar to the implementation structure shown in FIG. 9, as shown in FIG. 10, all surfaces of inner side walls of the respective grooves of the buffer layer 101, the gate insulation layer 102 and the interlayer insulation layer 103 are oblique planes, the surfaces of the inner side walls of the respective grooves provided in the buffer layer 101 and the gate insulation layer 102 are combined into two planes opposite to each other, which are on different planes from two planes formed by the surfaces of the inner side walls of the groove provided in the interlayer insulation layer 103. Therefore, the groove 200 penetrating from the interlayer insulation layer 103 to the buffer layer 101 includes a third groove part 203 corresponding to the buffer layer 101 and the gate insulation layer 102 and a fourth groove part 204 corresponding to the interlayer insulation layer 103.

In addition, as shown in FIG. 10, a resin layer 210 is deposited in the groove 200 in the bending area 141 of the fan-out area 140, and the resin layer 210 in the groove 200 is disposed according to the shape of the groove 200. The resin layer 210 is in direct contact with the substrate body 100 at the bottom of the groove 200.

In addition, in the implementation structure shown in FIG. 10, unlike the implementation structure shown in FIG. 9, the fan-out signal line 300 disposed in the groove 200 is arranged on the same layer and made of the same material with the data line of the pixel area 110 in the bending area 141 of the fan-out area 140, that is, the fan-out signal line 300 is deposited on the resin layer 210, and includes a first line segment which is arranged on the same layer and made of the same material with the data line of the pixel unit.

In addition, as shown in FIG. 10, and in combination with FIGS. 1 to 5, the fan-out area 140 further includes a second line segment 310 arranged on a same layer and made of same material with the gate line of the pixel area 110, a part of the fan-out signal line 300 (i.e., the first line segment) arranged in the bending area 141 is connected to the second line segment 310 through a via hole 211. Based on such configuration structure, the fan-out signal line 300 is connected to the signal line of the pixel area 110 by connecting to the second line segment 310.

Comparing FIG. 9 with FIG. 10, except that the connections of the fan-out signal line 300 in the fan-out area 140 to the signal line of the pixel area 110 are different, the configuration structures of the other parts of the two implementation structures are the same, and the configuration structure of the other parts can refer to the above detailed description, which will not be repeated herein.

Figure 11:
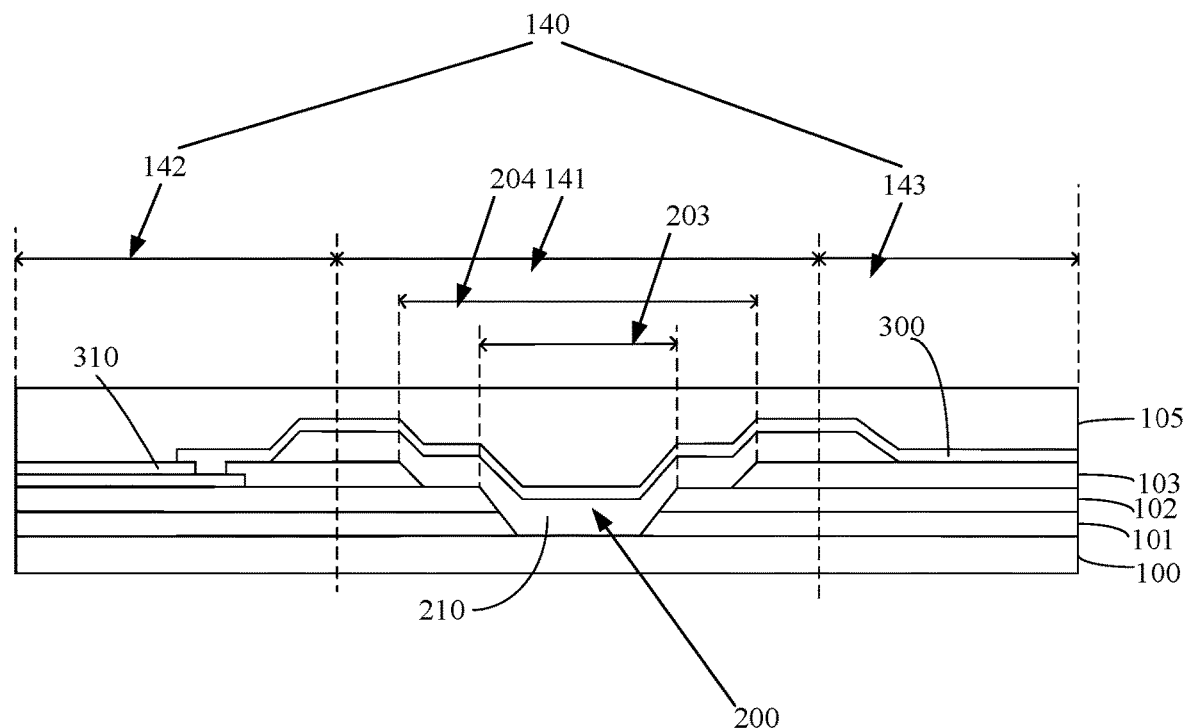
FIG. 11 is yet still another sectional schematic view of the fan-out area at the line A-A' in some implementation structures of the array substrate according to the embodiment of the present disclosure.
Figure 12:
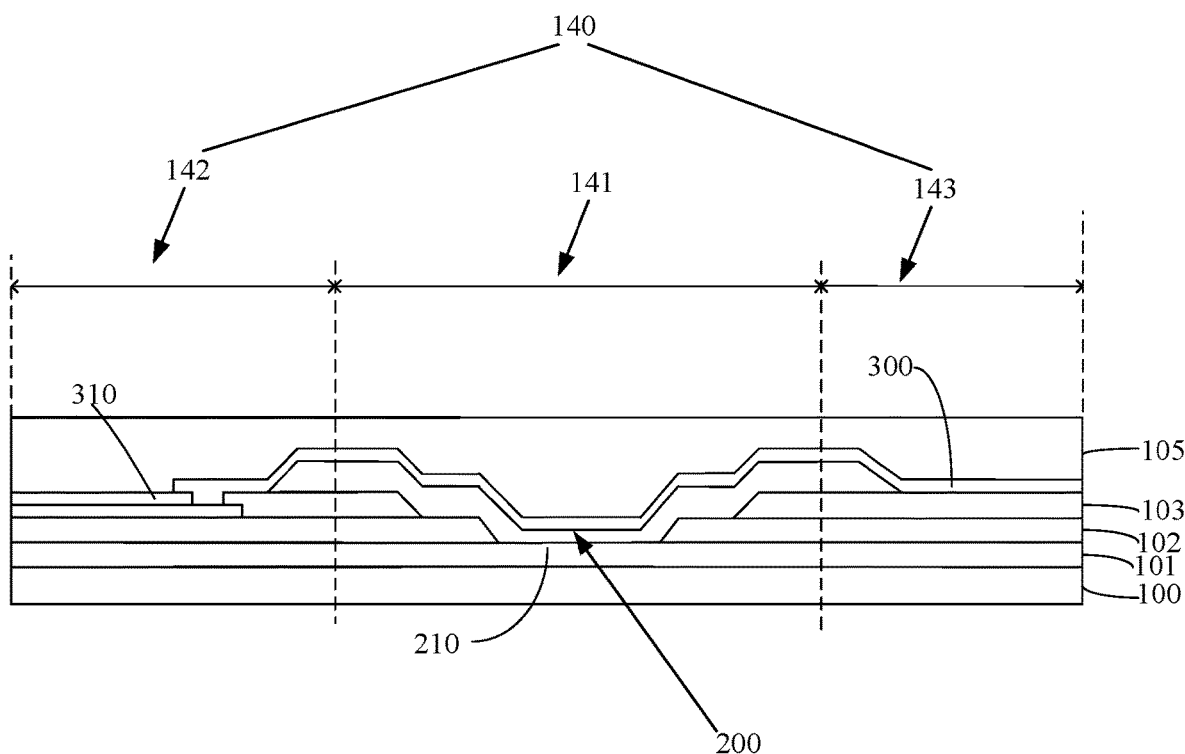
FIG. 12 is yet still another sectional schematic view of the fan-out area at the line A-A' in some implementation structures of the array substrate according to the embodiment of the present disclosure.

The array substrate with another implementation structure of is further provided in the present disclosure, as shown in FIG. 11. In the implementation structure, as compared with the implementation structure shown in FIG. 10, there is no passivation layer between the interlayer insulation layer 103 and the planarization layer 105 in the fan-out area 140, and the other parts of the two implementation structures have the same configuration structure.

It should be appreciated that, there is no passivation layer on the pixel area of the array substrate in the implementation structure, and the planarization layer is directly deposited on the fan-out signal line and connected to the fan-out signal line.

Based on the above configuration structure, as shown FIG. 11, in the bending area 141 of the fan-out region 140, the fan-out signal line 300 is deposited on the resin layer 210, and the planarization layer 105 is directly deposited on the fan-out signal line 300, thereby avoiding the arrangement of the fragile passivation layer. As compared with the array substrate with the implementation structure shown in FIG. 10, the breaking risk of the fan-out signal line 300 in the bending area is further reduced.

Comparing the array substrate of the implementation structure shown in FIG. 11 with the array substrate of the implementation structure shown in FIG. 10, except that there is no passivation layer, the other parts of the two implementation structures are the same, and the detailed structure of the other parts will not be described herein, which can refer to the contents of the above implementation structure.

In addition, the array substrate with another implementation structure is further provided in the present disclosure. In such implementation structure, as shown in FIG. 12, unlike the implementation structure shown in FIG. 11, in the bending area 141 of the fan-out area 140, the gate insulation layer 102 and the interlayer insulation layer 103 are provided with respective grooves, and the buffer layer 101 is provided with no groove. The respective grooves in the gate insulation layer 102 and the interlayer insulation layer 103 are mutually connected to form the groove 200 penetrating from the interlayer insulation layer 103 to the gate insulation layer 102.

Further, a size of the groove provided in the interlayer insulation layer 103 is larger than a size of the groove provided in the gate insulating layer 102, all surfaces of inner side walls of the respective grooves provided in the gate insulation layer 102 and the interlayer insulation layer 103 are oblique planes, and on different planes, thus the groove 200 is of a step-shaped structure.

Based on the above configuration structure, the gradient of the groove 200 in the bending area can also be reduced.

Comparing the array substrate with the implementation structure shown in FIG. 12 and the array substrate with the implementation structure shown in FIG. 11, except that no groove is provided within the buffer layer, the other parts of the two implementation structures are the same, and the detailed structure of the other parts will not be described herein, which can refer to the contents of the above implementation structures.

Further, the surface of the sidewall of the groove 200 may be of a step shape or a plane. For example, in the embodiments of FIG. 6 and FIG. 7, the two opposite sidewalls inside the groove 200 are both oblique planes relative to the substrate body 100, while in the embodiments of FIG. 8 to FIG. 12, the two opposite sidewalls inside the groove 200 are both of step shape.

It should be appreciated that the array substrate with the implementation structures shown in FIG. 6 to FIG. 12 are merely some of implementation structures of the array substrate according to the embodiments of the present disclosure, where the groove is provided in the inorganic insulation layer of the fan-out area, so as to reduce the thickness of the inorganic insulation layer in the fan-out area and increase the thickness of the planarization layer with better flexibility, thereby solving the problem that the signal line is easy to be broken due to the bending of the fan-out area. The present disclosure are not limited to thereto, and each possible implementation structure will not be described in detail herein.

In the above structure of the array substrate according to the embodiment of the present disclosure, the gate electrode, the source electrode and the drain electrode can be made of metal materials such as Cu, Al, Mo, Ti, Cr and W, or alloy of these materials, which can be a single-layered structure or a multi-layered structure such as Mo\Al\Mo, Ti\Cu\Ti or Mo\Ti\Cu. In addition, the active layer can be made of polysilicon-free material or oxide (e.g., Indium Gallium Zinc Oxide (IGZO)).

In the embodiment of the disclosure, the buffer layer can be made of silicon nitride or silicon oxide; the buffer layer can be a single-layered structure or a multi-layered structure such as silicon oxide\silicon nitride.

In the embodiment of the disclosure, the gate insulation layer can be made of silicon nitride or silicon oxide; the gate insulation layer can be a single-layered structure or a multi-layered structure such as silicon oxide\silicon nitride.

In the embodiment of the disclosure, the interlayer insulation layer can be made of silicon nitride or silicon oxide; the interlayer insulation layer can be a single-layered structure or a multi-layered structure such as silicon oxide\silicon nitride.

In the embodiment of the disclosure, the passivation layer can be made of silicon nitride or silicon oxide; the passivation layer can be a single-layered structure or a multi-layered structure such as silicon oxide\silicon nitride.

Further, the planarization layer can be made of resin material, the pixel definition layer can be made of resin material, the anode of the OLED can be made of Indium Tin Oxide (ITO), or the anode of OLED can be made of ITO and Ag, which form into an ITO/Ag/ITO structure. In addition, the cathode of the OLED can be made of Al or Ag.

In combination with FIG. 1 to FIG. 12, and in accordance with the detailed description of the array substrates according to the above embodiments of the present disclosure, a person skilled in the art may understand the specific manufacturing processes of the array substrates in the embodiments of the disclosure, which will not be described in detail herein.

On the other hand, a display panel is further provided in the embodiment of the present disclosure, and the display panel includes the array substrate with any one of the above structures.

In addition, a display device is further provided in the embodiment of the present disclosure, and the display device includes the above display panel.

With reference to FIG. 1 to FIG. 12, and referring to the above detailed description, a person skilled in the art may understand the specific structures of the display panel and the display device having the array substrates in the embodiments of the disclosure, which will not be described in detail herein.

In the array substrate, the display panel, and the display device according to the embodiments of the present disclosure, the inorganic insulation layer of the fan-out area is provided with the groove, and at least a part of the fan-out signal line is arranged in the groove, so as to reduce the thickness of the inorganic insulation layer in the bending area of the fan-out area and increase the thickness of the planarization layer with better flexibility, thereby solving the problem that the signal line is easy to be broken due to the bending of the inorganic insulation layer in the bending area. In addition, the fan-out signal line is further deposited on the flexible organic polymer material layer, and/or the gradient of the groove is reduced, and the flexibility of the fan-out signal line in the bending area of the fan-out area 140 is further ensured, thereby reducing the risk of being broken.

The above are preferred embodiments of the present disclosure. It should be appreciated that a person skilled in the art may make further modifications and improvements without departing from the principle of the present disclosure, and these modifications and improvements shall also fall within the scope of the present disclosure.

What is claimed is:

1. An array substrate, comprising:
   a substrate body, comprising a display area and a non-display area surrounding the display area, the non-display area comprising a fan-out area;
   a plurality of fan-out signal lines in the fan-out area;
   an inorganic insulation layer in the fan-out area, the inorganic insulation layer comprising a first groove;
   wherein the plurality of fan-out signal lines are configured to connect a plurality of signal lines in the display area;
   wherein the inorganic insulation layer is on the substrate body, and an orthographic projection of at least a part of the plurality of fan-out signal lines onto the substrate body is within an orthographic projection of the first groove onto the substrate body,
   wherein the plurality of signal lines in the display area comprise data lines, the plurality of fan-out signal lines comprise lead wires for the data lines, and the data lines are electrically connected to the lead wires for the data lines;
   each of the plurality of fan-out signal lines comprises a first line segment and a second line segment, wherein the first line segment and a data line of a pixel unit are on a same layer and made of a same material, the second line segment and a gate line of the pixel unit are on a same layer and made of a same material, and the first line segment is in the first groove.

2. The array substrate according to claim 1, wherein a bottom of the first groove is opposite to an opening of the first groove, a part of a surface of the substrate body constitutes the bottom of the first groove, and a part of the plurality of fan-out signal lines on the bottom of the first groove is in direct contact with the substrate body.

3. The array substrate according to claim 1, wherein a bottom of the first groove is opposite to an opening of the first groove, a part of a surface of the substrate body constitutes the bottom of the first groove, the first groove is filled with an organic polymer material layer, the organic polymer material layer is in direct contact with the bottom of the first groove, the plurality of fan-out signal lines are on a side of the organic polymer material layer distal to the substrate body, and are in direct contact with the organic polymer material layer.

4. The array substrate according to claim 3, wherein the bottom of the first groove is opposite to the opening of the first groove, the part of the surface of the substrate body constitutes the bottom of the first groove, the organic polymer material layer is in direct contact with the part of the surface of the substrate body.

5. The array substrate according to claim 1, wherein the inorganic insulation layer comprises a buffer layer, a gate insulation layer and an interlayer insulation layer arranged on the substrate body in that order, a depth of the first groove is not larger than a sum of a thickness of the buffer layer, a thickness of the gate insulation layer and a thickness of the interlayer insulation layer, and the plurality of fan-out signal lines are on the interlayer insulation layer.

6. The array substrate according to claim 5, wherein the first groove penetrates through the buffer layer, the gate insulation layer and the interlayer insulation layer to expose a part of a surface of the substrate body, and the plurality of fan-out signal lines are in direct contact with the part of the surface of the substrate body.

7. The array substrate according to claim 1, wherein the inorganic insulation layer is of a structure of at least two layers, a size of an opening of the first groove increases gradually in a direction that is perpendicular to the substrate body and away from the substrate body, and the opening is parallel to the substrate body.

8. The array substrate according to claim 7, wherein a surface of a side wall of the first groove is of a step shape, or is a plane.

9. The array substrate according to claim 8, wherein the inorganic insulation layer comprises a first inorganic insulation sub-layer and a second inorganic insulation sub-layer, and the first inorganic insulation sub-layer and the second inorganic insulation sub-layer are in direct contact with each other.

10. The array substrate according to claim 7, wherein the inorganic insulation layer comprises a buffer layer, a gate insulation layer and an interlayer insulation layer arranged on the substrate body in that order, a size of an opening of the first groove on the gate insulation layer is larger than a size of an opening of the first groove on the buffer layer, and a size of an opening of the first groove on the interlayer insulation layer is larger than the size of the opening of the first groove on the gate insulation layer.

11. The array substrate according to claim 10, wherein a side wall of a part of the first groove penetrating through the gate insulation layer and the interlayer insulation layer is of a first plane, a side wall of a part of the first groove penetrating through the buffer layer is of a second plane, and the first plane is different from the second plane.

12. The array substrate according to claim 10, wherein a side wall of a part of the first groove penetrating through the interlayer insulation layer is of a third plane, a side wall of a part of the first groove penetrating through the gate insulation layer and the buffer layer is of a fourth plane, and the third plane is different from the fourth plane.

13. The array substrate according to claim 3, wherein a part of the organic polymer material layer is located outside the first groove and is attached to the inorganic insulation layer.

14. The array substrate according to claim 1, wherein a plurality of pixel units is in the display area, and a driving circuit is further within the non-display area or the display area, and the driving circuit is connected to the plurality of pixel units via the plurality of fan-out signal lines and the plurality of signal lines in the display area.

15. The array substrate according to claim 3, wherein the substrate body is a flexible substrate body, or the organic polymer material layer is a flexible organic polymer material layer, or the substrate body is the flexible substrate body and the organic polymer material layer is the flexible organic polymer material layer.

16. A display panel, comprising the array substrate according to claim 1.

17. A display device, comprising the display panel according to claim 16.

18. The array substrate according to claim 1, further comprising a planarization layer, wherein the planarization layer is on a side of the fan-out signal line distal to the substrate body.

\* \* \* \* \*